US007176062B1

(12) United States Patent
Miks et al.

(10) Patent No.: US 7,176,062 B1
(45) Date of Patent: Feb. 13, 2007

(54) LEAD-FRAME METHOD AND ASSEMBLY FOR INTERCONNECTING CIRCUITS WITHIN A CIRCUIT MODULE

(75) Inventors: Jeffrey Alan Miks, Chandler, AZ (US); Kenneth Kaskoun, Phoenix, AZ (US); Markus Liebhard, Chandler, AZ (US); Donald Craig Foster, Mesa, AZ (US); Paul Robert Hoffman, Chandler, AZ (US); Frederic Bertholio, Oruck (FR)

(73) Assignee: Amkor Technology, Inc., Chandler, AZ (US)

( * ) Notice: Subject to any disclaimer, the term of this patent is extended or adjusted under 35 U.S.C. 154(b) by 77 days.

(21) Appl. No.: 11/035,239

(22) Filed: Jan. 13, 2005

Related U.S. Application Data

(62) Division of application No. 09/956,190, filed on Sep. 19, 2001, now Pat. No. 6,900,527.

(51) Int. Cl.
*H01L 21/50* (2006.01)
*H01L 21/48* (2006.01)
*H01L 21/44* (2006.01)
*H01L 23/02* (2006.01)
*H01L 23/52* (2006.01)
*H01L 23/495* (2006.01)

(52) U.S. Cl. ...................... 438/123; 438/124; 438/121; 438/106; 257/679; 257/690; 257/E23.031; 257/E23.052; 257/E23.043

(58) Field of Classification Search ................ 438/106, 438/121, 123–124; 257/678–679, 690, E23.064, 257/E23.52, E23.037, E23.031, E23.043
See application file for complete search history.

(56) References Cited

U.S. PATENT DOCUMENTS 2,596,993 A 5/1952 Gookin (Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Luan Thai
(74) *Attorney, Agent, or Firm*—Stetina Brunda Garred & Brucker

(57) ABSTRACT

A lead-frame method and assembly for interconnecting circuits within a circuit module allows a circuit module to be fabricated without a circuit board substrate. Integrated circuit dies are attached to a metal lead-frame assembly and the die interconnects are wire-bonded to interconnect points on the lead-frame assembly. An extension of the lead-frame assembly out of the circuit interconnect plane provides external electrical contacts for connection of the circuit module to a socket.

20 Claims, 3 Drawing Sheets

20 16A 17A 21 22 13A 30 12 16A 11A 13A

U.S. PATENT DOCUMENTS 3,435,815 A 4/1969 Forcier
3,734,660 A 5/1973 Davies et al.
3,838,984 A 10/1974 Crane et al.
4,054,238 A 10/1977 Lloyd et al.
4,189,342 A 2/1980 Kock
4,258,381 A 3/1981 Inaba
4,289,922 A 9/1981 Devlin
4,301,464 A 11/1981 Otsuki et al.
4,332,537 A 6/1982 Slepcevic
4,417,266 A 11/1983 Grabbe
4,451,224 A 5/1984 Harding
4,530,152 A 7/1985 Roche et al.
4,541,003 A 9/1985 Otsuka et al.
4,646,710 A 3/1987 Schmid et al.
4,707,724 A 11/1987 Suzuki et al.
4,727,633 A 3/1988 Herrick
4,737,839 A 4/1988 Burt
4,756,080 A 7/1988 Thorp, Jr. et al.
4,812,896 A 3/1989 Rothgery et al.
4,862,245 A 8/1989 Pashby et al.
4,862,246 A 8/1989 Masuda et al.
4,907,067 A 3/1990 Derryberry
4,920,074 A 4/1990 Shimizu et al.
4,935,803 A 6/1990 Kalfus et al.
4,942,454 A 7/1990 Mori et al.
4,987,475 A 1/1991 Schlesinger et al.
5,018,003 A 5/1991 Yasunaga
5,029,386 A 7/1991 Chao et al.
5,041,902 A 8/1991 McShane
5,057,900 A 10/1991 Yamazaki
5,059,379 A 10/1991 Tsutsumi et al.
5,065,223 A 11/1991 Matsuki et al.
5,070,039 A 12/1991 Johnson et al.
5,087,961 A 2/1992 Long et al.
5,091,341 A 2/1992 Asada et al.
5,096,852 A 3/1992 Hobson
5,118,298 A 6/1992 Murphy
5,122,860 A 6/1992 Kikuchi et al.
5,134,773 A 8/1992 LeMaire et al.
5,151,039 A 9/1992 Murphy
5,157,475 A 10/1992 Yamaguchi
5,157,480 A 10/1992 McShane et al.
5,168,368 A 12/1992 Gow, 3rd et al.
5,172,213 A 12/1992 Zimmerman
5,172,214 A 12/1992 Casto
5,175,060 A 12/1992 Enomoto et al.
5,200,362 A 4/1993 Lin et al.
5,200,809 A 4/1993 Kwon
5,214,845 A 6/1993 King et al.
5,216,278 A 6/1993 Lin et al.
5,218,231 A 6/1993 Kudo
5,221,642 A 6/1993 Burns
5,250,841 A 10/1993 Sloan et al.
5,252,853 A 10/1993 Michii
5,258,094 A 11/1993 Furui et al.
5,266,834 A 11/1993 Nishi et al.
5,273,938 A 12/1993 Lin et al.
5,277,972 A 1/1994 Sakumoto et al.
5,278,446 A 1/1994 Nagaraj et al.
5,279,029 A 1/1994 Burns
5,281,849 A 1/1994 Singh Deo et al.
5,294,897 A 3/1994 Notani et al.
5,327,008 A 7/1994 Djennas et al.
5,332,864 A 7/1994 Liang et al.
5,335,771 A 8/1994 Murphy
5,336,931 A 8/1994 Juskey et al.
5,343,076 A 8/1994 Katayama et al.
5,358,905 A 10/1994 Chiu
5,365,106 A 11/1994 Watanabe
5,381,042 A 1/1995 Lerner et al.
5,391,439 A 2/1995 Tomita et al.
5,406,124 A 4/1995 Morita et al.
5,410,180 A 4/1995 Fujii et al.
5,414,299 A 5/1995 Wang et al.
5,417,905 A 5/1995 Lemaire et al.
5,424,576 A 6/1995 Djennas et al.
5,428,248 A 6/1995 Cha
5,435,057 A 7/1995 Bindra et al.
5,444,301 A 8/1995 Song et al.
5,452,511 A 9/1995 Chang
5,454,905 A 10/1995 Fogelson
5,474,958 A 12/1995 Djennas et al.
5,484,274 A 1/1996 Neu
5,493,151 A 2/1996 Asada et al.
5,508,556 A 4/1996 Lin
5,517,056 A 5/1996 Bigler et al.
5,521,429 A 5/1996 Aono et al.
5,528,076 A 6/1996 Pavio
5,534,467 A 7/1996 Rostoker
5,539,251 A 7/1996 Iverson et al.
5,543,657 A 8/1996 Diffenderfer et al.
5,544,412 A 8/1996 Romero et al.
5,545,923 A 8/1996 Barber
5,581,122 A 12/1996 Chao et al.
5,592,019 A 1/1997 Ueda et al.
5,592,025 A 1/1997 Clark et al.
5,594,274 A 1/1997 Suetaki
5,595,934 A 1/1997 Kim
5,604,376 A 2/1997 Hamburgen et al.
5,608,265 A 3/1997 Kitano et al.
5,608,267 A 3/1997 Mahulikar et al.
5,625,222 A 4/1997 Yoneda et al.
5,633,528 A 5/1997 Abbott et al.
5,639,990 A 6/1997 Nishihara et al.
5,640,047 A 6/1997 Nakashima
5,641,997 A 6/1997 Ohta et al.
5,643,433 A 7/1997 Fukase et al.
5,644,169 A 7/1997 Chun
5,646,831 A 7/1997 Manteghi
5,650,663 A 7/1997 Parthasaranthi
5,661,088 A 8/1997 Tessier et al.
5,665,651 A * 9/1997 Asada et al. .................. 29/827
5,665,996 A 9/1997 Williams et al.
5,673,479 A 10/1997 Hawthorne
5,683,806 A 11/1997 Sakumoto et al.
5,689,135 A 11/1997 Ball
5,696,666 A 12/1997 Miles et al.
5,701,034 A 12/1997 Marrs
5,703,407 A 12/1997 Hori
5,710,064 A 1/1998 Song et al.
5,723,899 A 3/1998 Shin
5,724,233 A 3/1998 Honda et al.
5,726,493 A 3/1998 Yamashita
5,736,432 A 4/1998 Mackessy
5,745,984 A 5/1998 Cole, Jr. et al.
5,753,532 A 5/1998 Sim
5,753,977 A 5/1998 Kusaka et al.
5,766,972 A 6/1998 Takahashi et al.
5,770,888 A 6/1998 Song et al.
5,776,798 A 7/1998 Quan et al.
5,783,861 A 7/1998 Son
5,801,440 A 9/1998 Chu et al.
5,814,877 A 9/1998 Diffenderfer et al.
5,814,881 A 9/1998 Alagaratnam et al.
5,814,883 A 9/1998 Sawai et al.
5,814,884 A 9/1998 Davis et al.
5,817,540 A 10/1998 Wark
5,818,105 A 10/1998 Kouda
5,821,457 A 10/1998 Mosley et al.
5,821,615 A 10/1998 Lee
5,834,830 A 11/1998 Cho
5,835,988 A 11/1998 Ishii
5,844,306 A 12/1998 Fujita et al.
5,856,911 A 1/1999 Riley 5,859,471 A 1/1999 Kuraishi et al.
5,866,939 A 2/1999 Shin et al.
5,871,782 A 2/1999 Choi
5,874,784 A 2/1999 Aoki et al.
5,877,043 A 3/1999 Alcoe et al.
5,886,397 A 3/1999 Ewer
5,886,398 A 3/1999 Low et al.
5,894,108 A 4/1999 Mostafazadeh et al.
5,897,339 A 4/1999 Song et al.
5,900,676 A 5/1999 Kweon et al.
5,903,049 A 5/1999 Mori
5,903,050 A 5/1999 Thurairajaratnam et al.
5,909,053 A 6/1999 Fukase et al.
5,915,998 A 6/1999 Stidham et al.
5,917,242 A 6/1999 Ball
5,939,779 A 8/1999 Kim
5,942,794 A 8/1999 Okumura et al.
5,951,305 A 9/1999 Haba
5,959,356 A 9/1999 Oh
5,969,426 A 10/1999 Baba et al.
5,973,388 A 10/1999 Chew et al.
5,976,912 A 11/1999 Fukutomi et al.
5,977,613 A 11/1999 Takata et al.
5,977,615 A 11/1999 Yamaguchi et al.
5,977,630 A 11/1999 Woodworth et al.
5,981,314 A 11/1999 Glenn et al.
5,986,333 A 11/1999 Nakamura
5,986,885 A 11/1999 Wyland
6,001,671 A 12/1999 Fjelstad
6,013,947 A 1/2000 Lim
6,018,189 A 1/2000 Mizuno
6,020,625 A 2/2000 Qin et al.
6,025,640 A 2/2000 Yagi et al.
6,031,279 A 2/2000 Lenz
RE36,613 E 3/2000 Ball
6,034,423 A 3/2000 Mostafazadeh et al.
6,040,626 A 3/2000 Cheah et al.
6,043,430 A 3/2000 Chun
6,060,768 A 5/2000 Hayashida et al.
6,060,769 A 5/2000 Wark
6,072,228 A 6/2000 Hinkle et al.
6,075,284 A 6/2000 Choi et al.
6,081,029 A 6/2000 Yamaguchi
6,084,310 A 7/2000 Mizuno et al.
6,087,715 A 7/2000 Sawada et al.
6,087,722 A 7/2000 Lee et al.
6,100,594 A 8/2000 Fukui et al.
6,113,473 A 9/2000 Constantini et al.
6,114,752 A 9/2000 Huang et al.
6,118,174 A 9/2000 Kim
6,118,184 A 9/2000 Ishio et al.
RE36,907 E 10/2000 Templeton, Jr. et al.
6,130,115 A 10/2000 Okumura et al.
6,130,473 A 10/2000 Mostafazadeh et al.
6,133,623 A 10/2000 Otsuki et al.
6,140,154 A 10/2000 Hinkle et al.
6,348,726 B1 2/2002 Bayan et al.
6,355,502 B1 3/2002 Kang et al.
6,369,447 B2 4/2002 Mori
6,369,454 B1 4/2002 Chung
6,373,127 B1 4/2002 Baudouin et al.
6,380,048 B1 4/2002 Boon et al.
6,384,472 B1 5/2002 Huang
6,388,336 B1 5/2002 Venkateshwaran et al.
6,395,578 B1 5/2002 Shin et al.
6,400,004 B1 6/2002 Fan et al.
6,410,979 B2 6/2002 Abe
6,414,385 B1 7/2002 Huang et al.
6,420,779 B1 7/2002 Sharma et al.
6,429,508 B1 8/2002 Gang
6,437,429 B1 8/2002 Su et al.
6,444,499 B1 9/2002 Swiss et al.
6,448,633 B1 9/2002 Yee et al.
6,452,279 B2 9/2002 Shimoda
6,459,148 B1 10/2002 Chun-Jen et al.
6,464,121 B2 10/2002 Reijnders
6,476,469 B2 11/2002 Huang et al.
6,476,474 B1 11/2002 Hung
6,482,680 B1 11/2002 Khor et al.
6,498,099 B1 12/2002 McLellan et al.
6,498,392 B2 12/2002 Azuma
6,507,096 B2 1/2003 Gang
6,507,120 B2 1/2003 Lo et al.
6,534,849 B1 3/2003 Gang
6,545,332 B2 4/2003 Huang
6,545,345 B1 4/2003 Glenn et al.
6,559,525 B2 5/2003 Huang
6,566,168 B2 5/2003 Gang
6,583,503 B2 6/2003 Akram et al.
6,603,196 B2 8/2003 Lee et al.
6,624,005 B1 9/2003 DiCaprio et al.
6,667,546 B2 12/2003 Huang et al.
6,843,421 B2 * 1/2005 Chhor et al. ................ 235/492
2001/0008305 A1 7/2001 McLellan et al.
2001/0014538 A1 8/2001 Kwan et al.
2002/0011654 A1 1/2002 Kimura
2002/0024122 A1 2/2002 Jung et al.
2002/0027297 A1 3/2002 Ikenaga et al.
2002/0140061 A1 10/2002 Lee
2002/0140068 A1 10/2002 Lee et al.
2002/0163015 A1 11/2002 Lee et al.
2003/0030131 A1 2/2003 Lee et al.
2003/0073265 A1 4/2003 Hu et al.
2004/0056277 A1 3/2004 Karnezos
2004/0061212 A1 4/2004 Karnezos
2004/0061213 A1 4/2004 Karnezos
2004/0063242 A1 4/2004 Karnezos
2004/0063246 A1 4/2004 Karnezos
2004/0065963 A1 4/2004 Karnezos

FOREIGN PATENT DOCUMENTS

EP 0393997 10/1990
EP 0459493 12/1991
EP 0720225 3/1996
EP 0720234 3/1996
EP 0794572 A2 10/1997
EP 0844665 5/1998
EP 0936671 8/1999
EP 0989608 3/2000
EP 1032037 8/2000
JP 55163868 12/1980
JP 5745959 3/1982
JP 58160096 8/1983
JP 59208756 11/1984
JP 59227143 12/1984
JP 60010756 1/1985
JP 60116239 8/1985
JP 60195957 10/1985
JP 60231349 11/1985
JP 6139555 2/1986
JP 61248541 11/1986
JP 629639 1/1987
JP 6333854 2/1988
JP 63067762 3/1988
JP 63188964 8/1988
JP 63205935 8/1988
JP 63233555 9/1988
JP 63249345 10/1988
JP 63289951 11/1988
JP 63316470 12/1988
JP 64054749 3/1989
JP 1106456 4/1989
JP 1175250 7/1989
JP 1205544 8/1989
JP 1251747 10/1989

| | | |
|---|---|---|
| JP | 2129948 | 5/1990 |
| JP | 369248 | 7/1991 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 96-4284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 11307675 | 11/1999 |
| JP | 00150765 | 5/2000 |
| JP | 556398 | 10/2000 |
| JP | 2001060648 | 3/2001 |
| JP | 200204397 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 16620052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 0049944 | 6/2002 |
| WO | 9956316 | 11/1999 |
| WO | 9967821 | 12/1999 |

OTHER PUBLICATIONS

Vishay, “4 Milliohms in the So-8: Vishay Siliconix Sets New Record for Power MOSFET On-Resistance,” Press Release from webpage, 3 pages, www.vishay.com/news/releases, Nov. 7, 2002.

Patrick Mannion, “MOSFETs Break out of the Shackles of Wire Bonding,” Informational Packet, 5 pages, Electronic Design, Mar. 22, 1999 vol. 47; No. 6, www.elecdesign.com/1999/mar2299/ti/0322til.shtml.

* cited by examiner

LEAD-FRAME METHOD AND ASSEMBLY FOR INTERCONNECTING CIRCUITS WITHIN A CIRCUIT MODULE

RELATED APPLICATION

The present application is a divisional of U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001 now U.S. Pat. No. 6,900,527.

FIELD OF THE INVENTION

The present invention relates generally to circuit modules, and more specifically, to a method and assembly for interconnecting circuits within a circuit module.

BACKGROUND OF THE INVENTION

Circuit modules or cards are increasing in use to provide storage and other electronic functions for devices such as digital cameras, personal computing devices and personal digital assistants (PDAs). New uses for circuit modules include multimedia cards and secure digital cards.

Typically, circuit modules contain multiple integrated circuit devices or "dies". The dies are interconnected using a circuit board substrate, which adds to the weight, thickness and complexity of the module. Circuit modules also have electrical contacts for providing an external interface to the insertion point or socket, and these electrical contacts are typically circuit areas on the backside of the circuit board substrate, and the connection to the dies are provided through vias through the circuit board substrate. Producing vias in the substrate adds several process steps to the fabrication of the circuit board substrate, with consequent additional costs.

Therefore, it would be desirable to provide a method and assembly for interconnecting circuits within modules that require no circuit board substrate.

SUMMARY OF THE INVENTION

A circuit module assembly and method for interconnecting circuits within modules to provide a circuit module that may be fabricated without a circuit board substrate. A lead-frame assembly is connected to one or more dies and external contacts may be provided by an extension of the lead-frame assembly out of the plane of the die interconnect.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
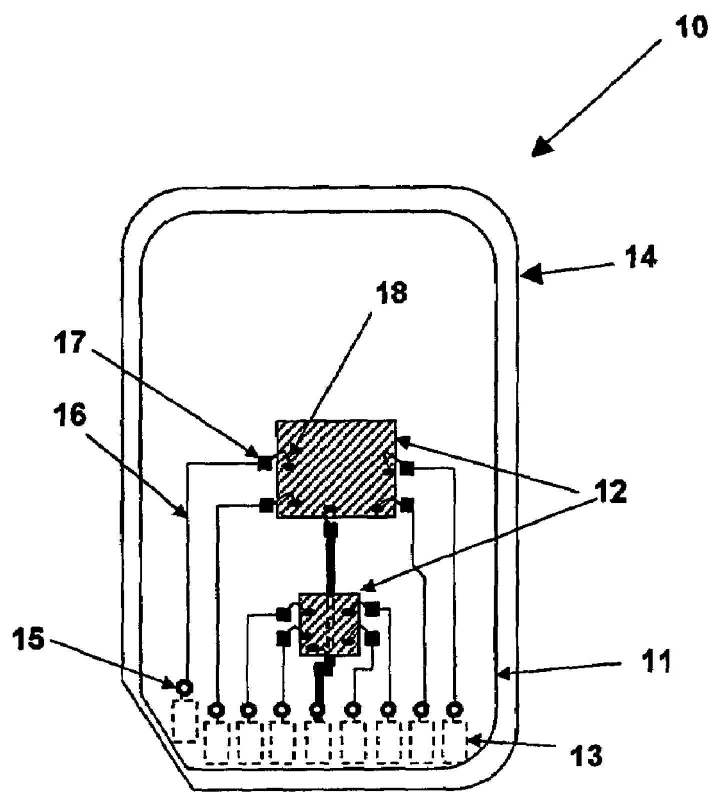
FIG. 1A is a pictorial diagram depicting a top view and FIG. 1B is a pictorial diagram depicting a cross section of a prior art circuit module.

Referring now to the figures and in particular to FIG. 1A a top view of a prior art circuit module 10 is depicted. Circuit module 10 is depicted as a circuit module as used in various multimedia card memory applications. The present invention is also applicable to cards and modules having other outlines such as secure digital cards and to peripheral device cards (I/O cards), as well.

A carrier 14 to which the integrated circuit dies 12 are attached and circuit contacts 13 are included on the bottom side, is covered by a cover 11 that is bonded to carrier 14. The circuit module housing may be completely formed from an encapsulant, or the circuit may be encapsulated and a lid 19 applied over the encapsulant. Dies 12 are coupled to each other and to circuit contacts 13 by circuit traces 16, which are typically etched from a metal layer on the top of carrier 14. Circuit contacts 13 are coupled by means of plated-through holes 15 that pass through carrier 14. The bottom side of carrier 14 is also typically etched from a metal layer on the bottom side forming electrical contacts 13 that are generally plated with a corrosion resistant material such as gold and circuit contacts 13 connect on the bottom side of carrier 14 to plated-through holes 15 by circuit traces on the bottom side of carrier 14. Circuit traces 16 include wire bonding areas 17 that may also be plated, permitting a wire bonding apparatus to electrically couple dies 12 by wires 18.

Figure 1B:
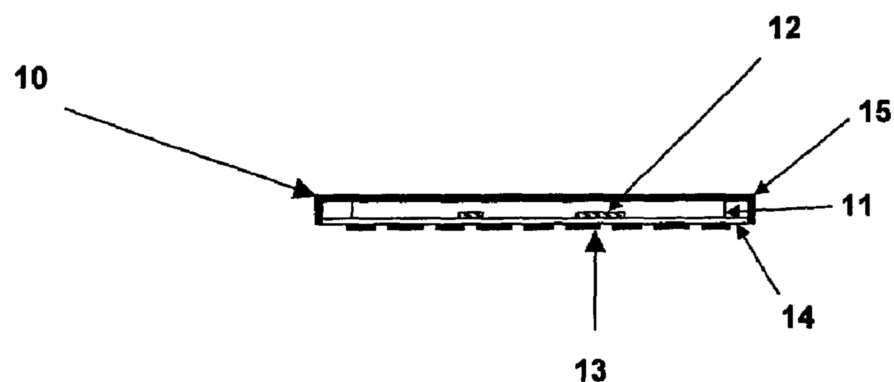

Referring now to FIG. 1B, a cross section end view of circuit module 10 is depicted. Dies 12 are covered by cover 11 and are bonded to carrier 14. Circuit contacts 13 are disposed on the bottom side of carrier 14 to provide electrical connections to the external circuits via a socket in which circuit module 10 is inserted.

The present invention provides a circuit module that does not require a separate carrier, wherein the circuit paths between dies 12 and electrical contacts 13 are provided by a conductive lead-frame to which dies 12 are bonded and an encapsulant applied surrounding the lead-frame to provide support and electrical insulation.

Figure 2A:
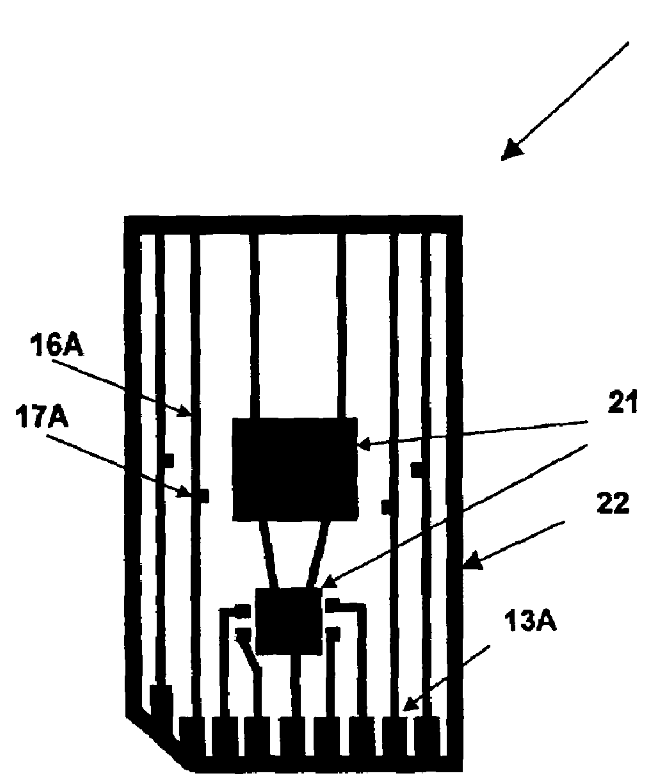
FIG. 2A is a pictorial diagram depicting a top view and FIG. 2B is a pictorial diagram depicting a cross section of a lead-frame in accordance with an embodiment of the invention.

Referring now to FIG. 2A, a top view of a lead-frame 20 in accordance with an embodiment of the invention is depicted. Circuit traces 16A are supported by a dam bar 22 that surrounds the periphery of the lead-frame, providing rigidity during the fabrication and integration processes. Lead-frame 20 is generally stamped from a metal, such as copper, and integrated circuit dies are bonded to lead-frame in die bonding areas 21. Wire bonding pads 17A are provided on circuit traces 16A to permit attachment of wires from dies to the lead-frame. The lead-frame is then encapsulated and portions of dam bar 22 are cut, resulting in electrical isolation of circuit traces 16A, after mechanical rigidity has been provided by the encapsulant.

In addition or in alternative to wire bonding pads 17A, pads may be included for attachment of surface mounted passive components by soldering or conductive adhesive attachment, and pad grids may be included for attachment of pre-packaged integrated circuits.

Figure 2B:
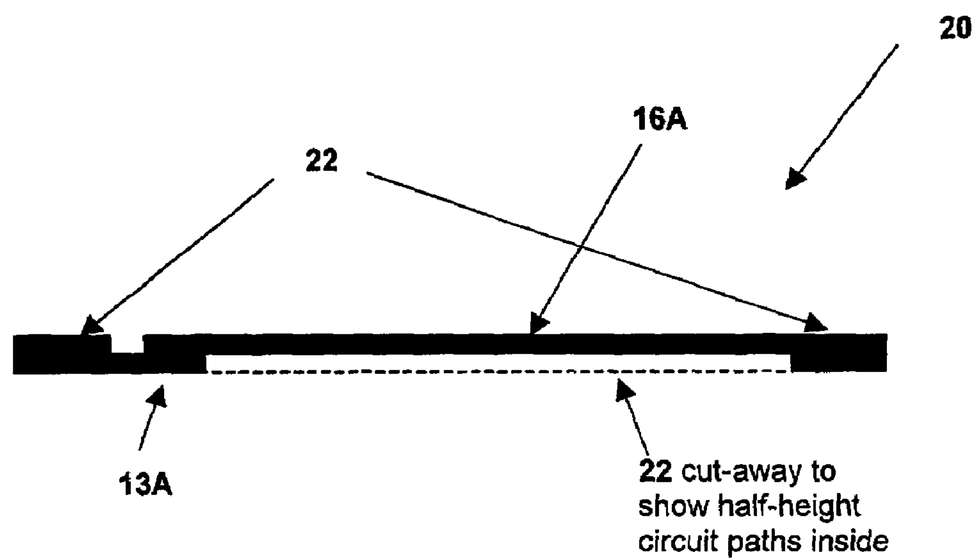

Referring now to FIG. 2B, a cross-section side view of lead-frame 20 is depicted. Dam bar 22 is shown at ends of the lead-frame and is cut-away along the sides in the figure to illustrate that circuit traces 17A are a half-thickness of metal with respect to dam bar 22. This half-thickness may be produced by etching the bottom side of lead-frame after applying an etchant resistant coating to dam bar and circuit contacts 13A. Circuit contacts 13A are also partially a half-thickness of metal, produced by etching the top side of lead-frame after applying an etchant resistive coating to circuit traces 16A and dam bar 22. The etching of both sides of lead-frame 20 results in a circuit that has circuit contacts 13A disposed as an extension out of the plane of circuit traces 16A, while the full thickness portion of the electrical contacts/circuit trace combination produces a continuous conductive and mechanically rigid connection from circuit traces 16A to circuit contacts 13A. Thus, encapsulant may be applied beneath circuit traces and the circuit contact 13A surfaces may protrude from the encapsulant, providing an interface connection external to a circuit module.

As an alternative, circuit contacts 13A may be fabricated in the same plane as circuit traces 16A and additional length supplied so that the circuit traces may be bent to provide an extension out of the plane of circuit traces 16A so that circuit contacts 13A may protrude from an encapsulant applied beneath lead-frame 20.

The illustrative embodiments herein depict an etched lead-frame, but lead-frames may also be stamped in accordance with an embodiment of the present invention. The alternative embodiment depicted, wherein circuit traces are bent to provide circuit contacts especially lends itself to stamping, because the circuit traces may be formed and bent in a single stamping operation.

Figure 3A:
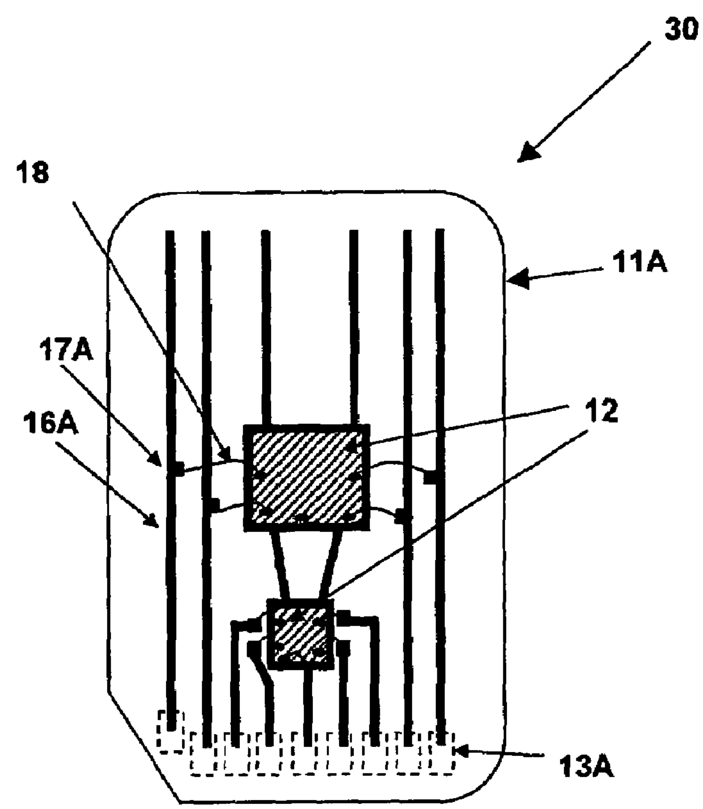
FIG. 3A is a pictorial diagram depicting a top view and FIG. 3B is a pictorial diagram depicting a cross section of a circuit module in accordance with an embodiment of the invention.

Referring now to FIG. 3A, a top view of a circuit module 30, in accordance with an embodiment of the invention is depicted. The depiction shows the internal features after dies 12 have been bonded to lead-frame 20, an encapsulant cover 11A applied and the dam bar 22 is singulated from circuit module 30. The resulting circuit module 30 has circuit traces 16A that are isolated (but supported by the encapsulant) and wires 18 have been bonded from dies 12 to bonding pads 17A. Circuit contacts 13A are located at the bottom surface of encapsulant cover 11A and protrude from or are conformal to the bottom surface to provide an external electrical connection.

Figure 3B:
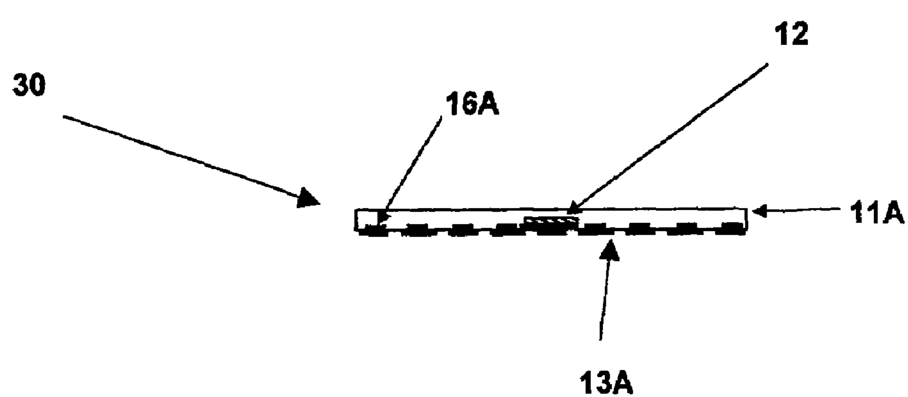

Referring now to FIG. 3B, a cross-section end view of a circuit module 30, in accordance with an embodiment of the invention is depicted. The plane of circuit traces 16A adjacent to the plane of electrical contacts 13A may be seen from the figure. Die 12 is shown as mounted above the plane of circuit traces 16A, but a mounting within the plane of circuit traces is also possible. Additionally, circuit contacts 13A may be attached using plating techniques to attach to circuit traces 16A rather than including the circuit contacts within the lead-frame.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of fabricating a memory card, comprising the steps of:

a) providing a lead-frame carrier having opposed top and bottom sides, a plurality of contacts, and a plurality of traces;

b) etching the lead-frame carrier in a manner wherein each of the traces defines a bottom trace surface, each of the contacts defines opposed top and bottom contact surfaces, the bottom trace surfaces and the bottom contact surfaces extend along respective ones of spaced, generally parallel planes, and the bottom trace surfaces and the top contact surfaces extend in generally co-planar relation to each other;

c) attaching an integrated circuit die to the lead-frame carrier;

d) electrically connecting the integrated circuit die to at least one of the traces; and e) partially encapsulating the lead-frame carrier and the integrated circuit die with an encapsulation such that the bottom contact surfaces are exposed in a bottom surface defined by the encapsulation.

2. The method of claim 1 wherein:

step (a) comprises providing a lead-frame carrier which includes at least one die bonding area; and step (c) comprises attaching the integrated circuit die to the die bonding area.

3. The method of claim 2 wherein:

step (a) comprises providing a lead-frame carrier wherein the die bonding area defines opposed top and bottom die bonding area surfaces and each of the traces further defines a top trace surface; and step (c) comprises attaching the integrated circuit die to the top die bonding area surface of the die bonding area.

4. The method of claim 3 wherein step (a) comprises providing a lead-frame carrier wherein the top die bonding area surface and the bottom contact surfaces extend along respective ones of spaced, generally parallel planes.

5. The method of claim 3 wherein step (a) comprises providing a lead-frame carrier wherein the top trace surfaces and the top bonding pad area surface extend in generally co-planar relation to each other.

6. The method of claim 1 wherein step (b) comprises applying an etchant to prescribed areas of the top and bottom sides of the lead-frame carrier.

7. The method of claim 1 wherein step (e) comprises forming the encapsulation such that the top contact surfaces and the bottom trace surfaces are covered thereby.

8. The method of claim 1 wherein:

step (a) comprises providing a lead-frame carrier wherein each of the traces includes a bonding pad formed thereon; and step (d) comprises electrically connecting the integrated circuit die to respective ones of the bonding pads through the use of a plurality of conductive wires.

9. The method of claim 1 wherein:

step (a) comprises providing a lead-frame carrier wherein each of the contacts is connected to a dambar of the lead-frame carrier; and step (e) comprises forming the encapsulation such that the dambar protrudes therefrom.

10. The method of claim 9 further comprising the step of:

f) removing the dambar from the lead-frame carrier to facilitate the electrical isolation of the contacts from each other.

11. A method of fabricating a memory card, comprising the steps of:

a) providing a lead-frame carrier having opposed top and bottom sides, at least two die bonding areas, a plurality of contacts which each define a bottom contact surface, and a plurality of traces which each define a bottom trace surface, at least one of the traces being sized to extend along both of the at least two die bonding areas;

b) bending the traces in a manner wherein the bottom contact surfaces and portions of each of the bottom trace surfaces extend along respective ones of spaced, generally parallel planes;

c) attaching an integrated circuit die to each of the die bonding areas of the lead-frame carrier;

d) electrically connecting each of the integrated circuit dies to at least one of the traces; and e) partially encapsulating the lead-frame carrier and the integrated circuit dies with an encapsulation such that the bottom contact surfaces are exposed in a bottom surface defined by the encapsulation.

12. The method of claim 11 wherein:

step (a) comprises providing a lead-frame carrier wherein one of the contacts is laterally offset relative to the remainder of the contacts which are arranged in a generally straight row; and step (e) comprises forming the encapsulation to define a chamfered surface which is disposed adjacent the one of the contacts which is laterally offset relative to the remainder of the contacts.

13. The method of claim 11 wherein:

step (a) comprises providing a lead-frame carrier wherein each of the die bonding areas defines opposed top and bottom die bonding area surfaces; and step (c) comprises attaching each of the integrated circuit dies to the top die bonding area surface of a respective one of the die bonding areas.

14. The method of claim 13 wherein step (b) comprises bending the traces such that the bottom die bonding area surfaces and the bottom contact surfaces extend along respective ones of spaced, generally parallel planes.

15. The method of claim 11 wherein:

step (a) comprises providing a lead-frame carrier wherein each of the contacts further defines a top contact surface and each of the traces further defines a top trace surface; and step (e) comprises forming the encapsulation such that the top contact surfaces and the top and bottom trace surfaces are covered thereby.

16. The method of claim 11 wherein:

step (a) comprises providing a lead-frame carrier wherein each of the traces includes a bonding pad formed thereon; and step (d) comprises electrically connecting each of the integrated circuit dies to respective ones of the bonding pads through the use of a plurality of conductive wires.

17. The method of claim 16 wherein step (a) comprises providing a lead-frame carrier wherein the bonding pad extends laterally from the at least one trace which is sized to extend along both of the at least two die bonding areas.

18. The method of claim 11 wherein:

step (a) comprises providing a lead-frame carrier wherein each of the contacts is connected to a dambar of the lead-frame carrier; and step (e) comprises forming the encapsulation such that the dambar protrudes therefrom.

19. The method of claim 18 further comprising the step of:

f) removing the dambar from the lead-frame carrier to facilitate the electrical isolation of the contacts from each other.

20. A method of fabricating a memory card, comprising the steps of:

a) providing a lead-frame carrier having opposed top and bottom sides, a plurality of contacts, and a plurality of traces;

b) etching the lead-frame carrier in a manner wherein each of the traces defines a bottom trace surface, each of the contacts defines opposed top and bottom contact surfaces, and the bottom trace surfaces and the bottom contact surfaces extend along respective ones of spaced, generally parallel planes;

c) attaching an integrated circuit die to the lead-frame carrier;

d) electrically connecting the integrated circuit die to at least one of the traces; and e) partially encapsulating the lead-frame carrier and the integrated circuit die with an encapsulation such that the bottom contact surfaces are exposed in a bottom surface defined by the encapsulation, and the top contact surfaces and the bottom trace surfaces are covered by the encapsulation.

* * * * *